(12) United States Patent
Verma et al.

(10) Patent No.: US 11,133,270 B1
(45) Date of Patent: Sep. 28, 2021

(54) INTEGRATED CIRCUIT DEVICE AND FABRICATION METHOD THEREOF

(71) Applicant: UNITED MICROELECTRONICS CORP., Hsin-Chu (TW)

(72) Inventors: Purakh Raj Verma, Singapore (SG); Kuo-Yuh Yang, Hsinchu County (TW); Chia-Huei Lin, Hsinchu (TW); Chu-Chun Chang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/914,482

(22) Filed: Jun. 29, 2020

(30) Foreign Application Priority Data

May 25, 2020 (CN) .......................... 202010447437.5

(51) Int. Cl.
| | |
|---|---|
| *H01L 23/00* | (2006.01) |
| *H01L 27/12* | (2006.01) |
| *H01L 23/58* | (2006.01) |
| *H01L 21/84* | (2006.01) |
| *H01L 23/66* | (2006.01) |
| *H01L 27/06* | (2006.01) |

(52) U.S. Cl.
CPC ............ *H01L 23/564* (2013.01); *H01L 21/84* (2013.01); *H01L 23/562* (2013.01); *H01L 23/585* (2013.01); *H01L 23/66* (2013.01); *H01L 27/1203* (2013.01); *H01L 27/067* (2013.01)

(58) Field of Classification Search
CPC ..... H01L 23/564; H01L 21/84; H01L 23/562; H01L 23/585; H01L 23/66; H01L 27/1203; H01L 27/667
USPC .......................... 257/506, 508; 438/348, 361
See application file for complete search history.

(56) References Cited

U.S. PATENT DOCUMENTS

| | | | |
|---|---|---|---|
| 6,566,735 B1 | 5/2003 | Minn | |
| 7,223,673 B2 | 5/2007 | Wang | |
| 7,279,775 B2 | 10/2007 | Kim | |
| 2017/0069620 A1* | 3/2017 | Tu et al. | ............. H01L 27/0067 |

* cited by examiner

*Primary Examiner* — Thinh T Nguyen
(74) *Attorney, Agent, or Firm* — Winston Hsu

(57) ABSTRACT

An integrated circuit device includes a substrate, an integrated circuit region on the substrate, a seal ring disposed in a dielectric stack of the integrated circuit region and around a periphery of the integrated circuit region, a trench around the seal ring and exposing a sidewall of the dielectric stack, a moisture blocking layer continuously covering the integrated circuit region and extending to the sidewall of the dielectric stack, thereby sealing a boundary between two adjacent dielectric films in the dielectric stack; and a passivation layer over the moisture blocking layer.

15 Claims, 3 Drawing Sheets

INTEGRATED CIRCUIT DEVICE AND FABRICATION METHOD THEREOF

BACKGROUND OF THE INVENTION

1. Field of the Invention

The present invention relates to the field of semiconductor technology, and in particular to an improved integrated circuit device and a method of manufacturing the same.

2. Description of the Prior Art

Seal ring formation is an important part in the back-end of semiconductor processes. Seal rings are stress protection structures around integrated circuits, protecting the internal circuit inside semiconductor chips from damage caused by the dicing of the semiconductor chips from wafers.

Another function of the seal ring is to protect the integrated circuits on the inner side of seal ring from moisture-induced degradation. Since dielectric layers of the integrated circuits are typically formed of porous low-k dielectric materials, moisture can easily penetrate through low-k dielectric layer to reach the integrated circuits.

Conventional seal rings are electrically continuous around the periphery of a die, and the direct electrical path around the periphery of the die can transfer noise to sensitive analog and radio-frequency (RF) blocks, which is undesirable. One conventional solution to prevent noise transfer is the use of electrically discontinuous seal ring, thereby inhibiting a significant portion of the noise transfer. However, the discontinuities of the seal ring allow for penetration of the semiconductor die by harmful moisture and other contaminants.

SUMMARY OF THE INVENTION

One object of the present invention is to provide an improved integrated circuit device and a manufacturing method thereof to solve the above-mentioned shortcomings and shortcomings of the prior art.

One aspect of the invention provides an integrated circuit device including a substrate; an integrated circuit region on the substrate, said integrated circuit region comprising a dielectric stack; a seal ring disposed in said dielectric stack and around a periphery of the integrated circuit region; a trench around the seal ring and exposing a sidewall of the dielectric stack; a moisture blocking layer continuously covering the integrated circuit region and extending to the sidewall of the dielectric stack, thereby sealing a boundary between two adjacent dielectric films in the dielectric stack; and a passivation layer over the moisture blocking layer.

According to some embodiments, the integrated circuit region comprises a radio-frequency (RF) circuit.

According to some embodiments, the substrate is a silicon-on-insulator (SOI) substrate comprising a lower substrate, a buried oxide layer on the lower substrate, and a device layer on the buried oxide layer.

According to some embodiments, the device layer comprises a silicon layer.

According to some embodiments, the seal ring is electrically coupled to the lower substrate with a through contact that penetrates through the device layer and the buried oxide layer.

According to some embodiments, the two adjacent dielectric films are two adjacent low-dielectric constant (low-k) dielectric films.

According to some embodiments, the seal ring is a discontinuous seal ring.

According to some embodiments, the seal ring is composed of interconnected metal wires and vias.

According to some embodiments, the metal wires comprise an uppermost copper metal wire and the moisture blocking layer is in direct contact with the uppermost copper metal wire.

According to some embodiments, the uppermost copper metal wire is an uppermost damascene copper wire and the moisture blocking layer also acts as a capping layer covering a top surface of the uppermost damascene copper wire.

According to some embodiments, the integrated circuit device further includes: an uppermost dielectric film covering the moisture blocking layer; an uppermost via penetrating through the uppermost dielectric film and the moisture blocking layer to electrically connect with the uppermost copper metal wire; and an aluminum pad disposed on and electrically connected to the uppermost via.

According to some embodiments, the passivation layer covers a periphery of the aluminum pad and a top surface of the uppermost dielectric film.

According to some embodiments, the uppermost dielectric film comprises silicon oxide.

According to some embodiments, the passivation layer comprises polyimide, silicon nitride, or silicon oxide.

According to some embodiments, the moisture blocking layer comprises silicon nitride, silicon oxynitride, or silicon carbonitride.

Another aspect of the invention provides a method of forming integrated circuit device, including: providing a substrate; forming an integrated circuit region on the substrate, the integrated circuit region comprising a dielectric stack; forming a seal ring in the dielectric stack and around a periphery of the integrated circuit region; forming a trench around the seal ring and the trench exposing a sidewall of the dielectric stack; forming a moisture blocking layer continuously covering the integrated circuit region and extending to the sidewall of the dielectric stack, thereby sealing a boundary between two adjacent dielectric films in the dielectric stack; and forming a passivation layer over the moisture blocking layer.

According to some embodiments, the integrated circuit region comprises a radio-frequency (RF) circuit.

According to some embodiments, the substrate is a silicon-on-insulator (SOI) substrate comprising a lower substrate, a buried oxide layer on the lower substrate, and a device layer on the buried oxide layer.

According to some embodiments, the device layer comprises a silicon layer.

According to some embodiments, the seal ring is electrically coupled to the lower substrate with a through contact that penetrates through the device layer and the buried oxide layer.

According to some embodiments, the two adjacent dielectric films are two adjacent low-dielectric constant (low-k) dielectric films.

According to some embodiments, the seal ring is a discontinuous seal ring.

According to some embodiments, the seal ring is composed of interconnected metal wires and vias.

According to some embodiments, the metal wires comprise an uppermost copper metal wire.

According to some embodiments, the uppermost copper metal wire is an uppermost damascene copper wire.

According to some embodiments, the method further includes: forming an uppermost dielectric film over the dielectric stack; forming an uppermost via penetrating through the uppermost dielectric film to electrically connect with the uppermost copper metal wire; and forming an aluminum pad disposed on and electrically connected to the uppermost via.

According to some embodiments, the passivation layer covers a periphery of the aluminum pad and a top surface of the uppermost dielectric film.

According to some embodiments, the uppermost dielectric film comprises silicon oxide.

According to some embodiments, the passivation layer comprises polyimide, silicon nitride, or silicon oxide.

According to some embodiments, the moisture blocking layer comprises silicon nitride, silicon oxynitride, or silicon carbonitride.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 5 are schematic diagrams of a method for forming an integrated circuit device according to an embodiment of the present invention, wherein FIG. 1 is a schematic top view of the integrated circuit device 1, and FIGS. 2 to 5 are cross-sectional views taken along line I-I' of FIG. 1.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
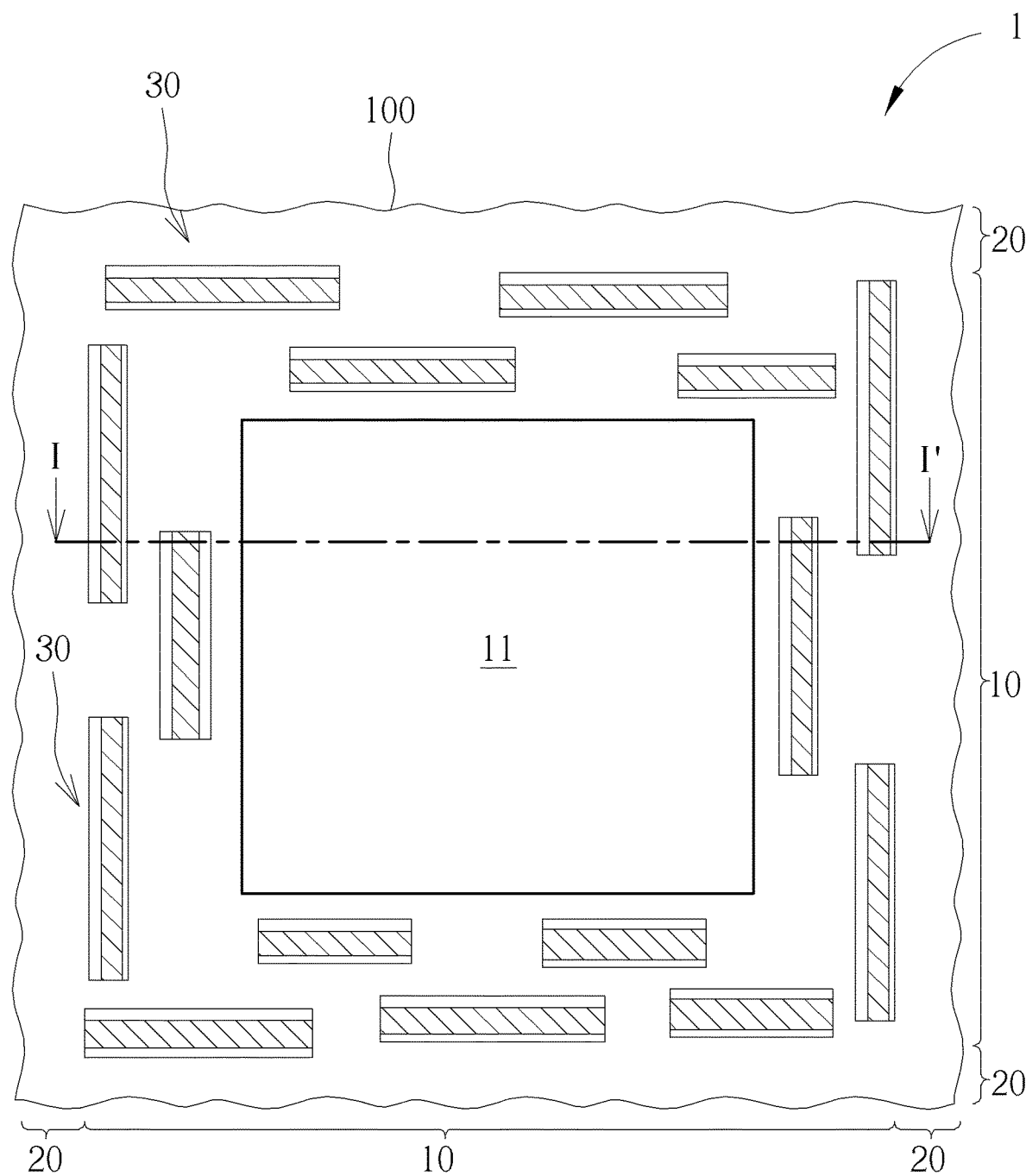

Please refer to FIGS. 1 to 5, which are schematic diagrams of a method for forming an integrated circuit device 1 according to an embodiment of the present invention. FIG. 1 is a schematic top view of the integrated circuit device 1. FIGS. 2 to 5 are cross-sectional views taken along line I-I' of FIG. 1.

Figure 2:
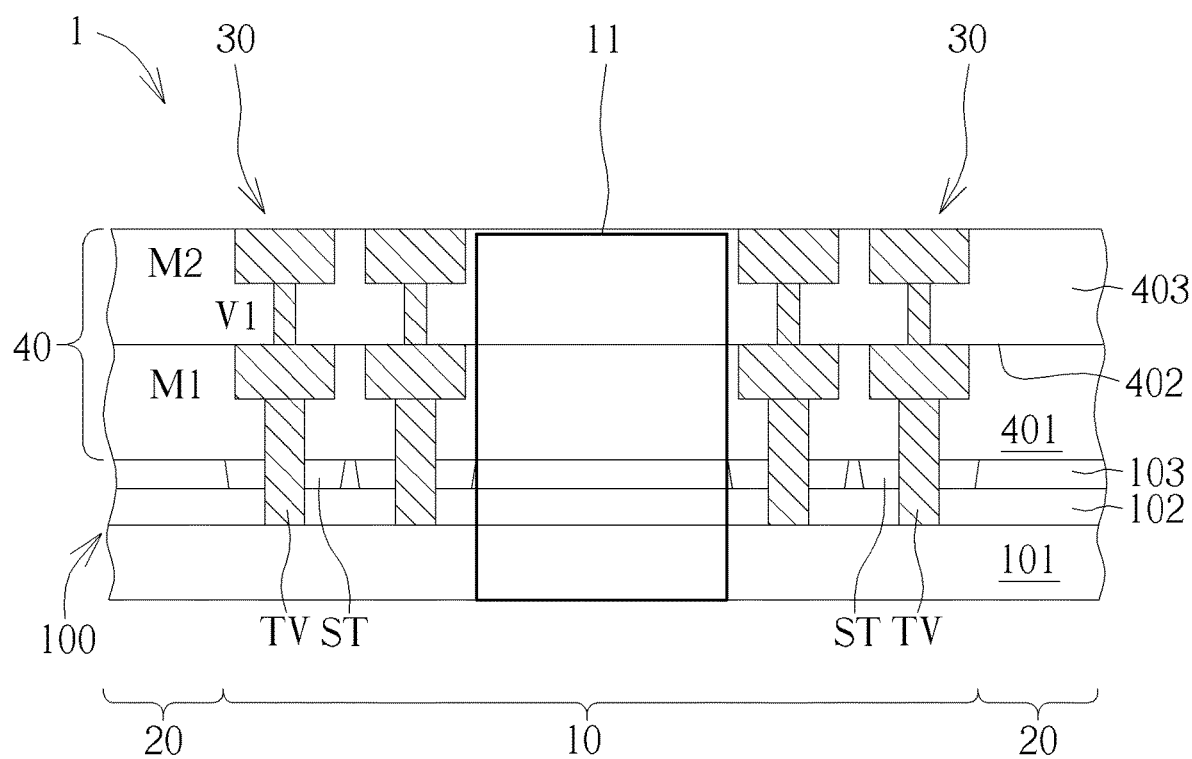

As shown in FIGS. 1 and 2, a substrate 100 is first provided. For example, the substrate 100 is a silicon-on-insulator (SOI) substrate including a lower substrate 101, a buried oxide layer 102 and a device layer 103 on the buried oxide layer 102. The lower substrate 101 may be a silicon substrate. The buried oxide layer 102 may be a silicon oxide layer. The device layer 103 may include a silicon layer, for example, a single crystalline silicon layer.

According to an embodiment of the invention, an integrated circuit region 10 is formed on the substrate 100. According to an embodiment of the invention, the integrated circuit region 10 includes a radio frequency (RF) circuit 11. For the sake of simplicity, the circuit elements and metal interconnection structure of the integrated circuit region 10 are not shown in FIG. 2. Next to the integrated circuit region 10 is a scribe lane region 20.

According to an embodiment of the invention, the integrated circuit region 10 includes a dielectric stack 40. According to an embodiment of the present invention, a structurally and electrically discontinuous seal ring 30 has been formed in the dielectric stack 40, and the seal ring 30 is disposed around a periphery of the integrated circuit region 10. The seal ring 30 can protect the radio frequency circuit 11 from damage caused by wafer dicing. The electrically discontinuous seal ring 30 can suppress noise transmission. However, due to the structural discontinuity of the seal ring 30, its ability to block moisture or contaminants from penetrating through the radio frequency circuit 11 is reduced. The present invention addresses this problem.

According to an embodiment of the present invention, as shown in FIG. 2, the dielectric stack 40 has at least two adjacent dielectric films 401 and 403, and a boundary 402 between the dielectric film 401 and the dielectric film 403. Moisture or stress may penetrate into the RF circuit 11 along the interface 402 between the dielectric film 401 and the dielectric film 403, causing corrosion or damage to the circuit structure. According to an embodiment of the present invention, the two adjacent dielectric films 401 and 403 may be two adjacent low dielectric constant (low-k) dielectric films. The term "low dielectric constant dielectric film" refers to a dielectric film with a dielectric constant less than 2.5.

According to an embodiment of the invention, the seal ring 30 is composed of interconnected metal wires M and vias V. For the sake of simplicity, FIG. 2 only illustrates the first metal wire layer M1, the second metal wire layer M2 and the via V1 between the first metal wire layer M1 and the second metal wire layer M2. According to an embodiment of the present invention, the second metal wire layer M2 is the uppermost copper metal wire, for example, the uppermost damascene copper metal wire. In other words, in this embodiment, the second metal wire layer M2 and the via V1 are interconnect structures formed by a dual damascene copper process, and there is no copper interconnects above the second metal wire layer M2. According to an embodiment of the invention, the seal ring 30 is electrically coupled to the lower substrate 101 via a through contact TV that penetrates the device layer 103 and the buried oxide layer 102. According to an embodiment of the present invention, the through contact TV penetrates the trench isolation region ST provided in the device layer 103.

Figure 3:
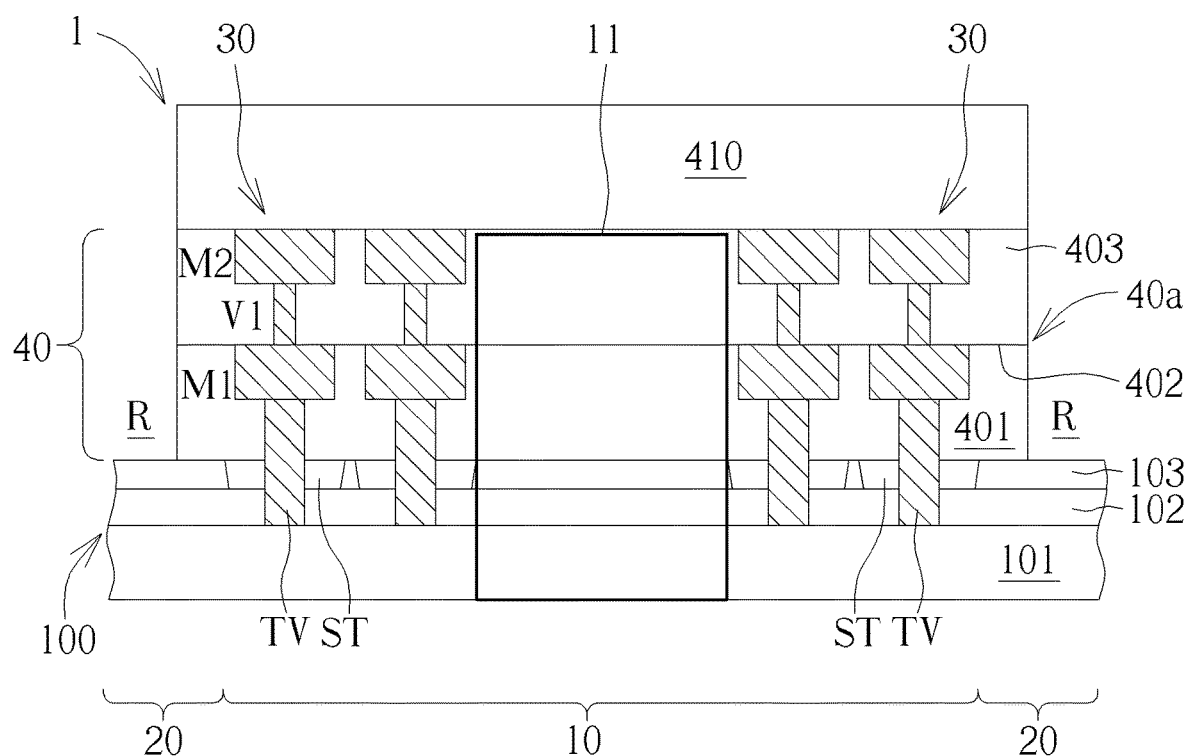

As shown in FIG. 3, after the chemical mechanical polishing (CMP) process of the second metal wire layer M2 is completed, a patterned photoresist layer 410 is then formed on the second metal wire layer M2 and the dielectric film 403. According to an embodiment of the invention, the patterned photoresist layer 410 covers the integrated circuit region 10 and exposes the scribe lane region 20. Next, an anisotropic dry etching process is performed to etch away the dielectric stack 40 not covered by the patterned photoresist layer 410, thereby revealing the device layer 103 in the scribe lane region 20, thus a trench R is formed in the scribe lane region 20.

According to an embodiment of the present invention, the trench R surrounds the seal ring 30, and the trench R exposes a sidewall 40a of the dielectric stack 40 and boundary 402 between the dielectric film 401 and the dielectric film 403 on the on the sidewall 40a. After forming the trench R, the remaining patterned photoresist layer 410 is then removed.

Figure 4:
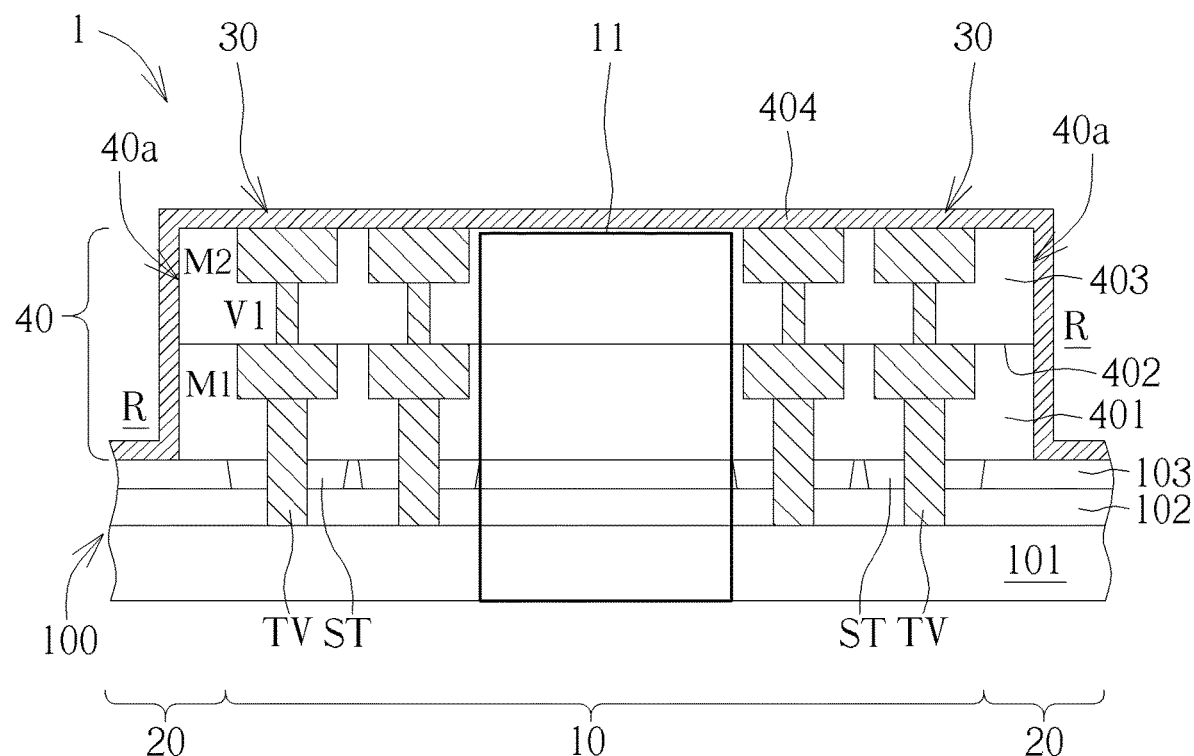

As shown in FIG. 4, a moisture blocking layer 404 is formed to continuously cover the integrated circuit region 10 and extend to the sidewall 40a of the dielectric stack 40 to seal the boundary 402 between two adjacent dielectric films 401 and 403 of the dielectric stack in 40, therefore, the moisture blocking layer 404 can effectively prevent moisture or contaminants from penetrating into the RF circuit 11. According to an embodiment of the invention, the moisture blocking layer 404 may include silicon nitride, silicon oxynitride, or silicon carbonitride. In addition, the moisture blocking layer 404 also directly contacts the upper surfaces of the second metal wire layer M2 and the dielectric film 403, and can simultaneously serve as a capping layer of the second metal wire layer M2. According to an embodiment of the invention, the moisture blocking layer 404 not only covers the sidewall 40a of the dielectric stack 40, but also extends into the scribe lane region 20 and covers the device layer 103.

Figure 5:
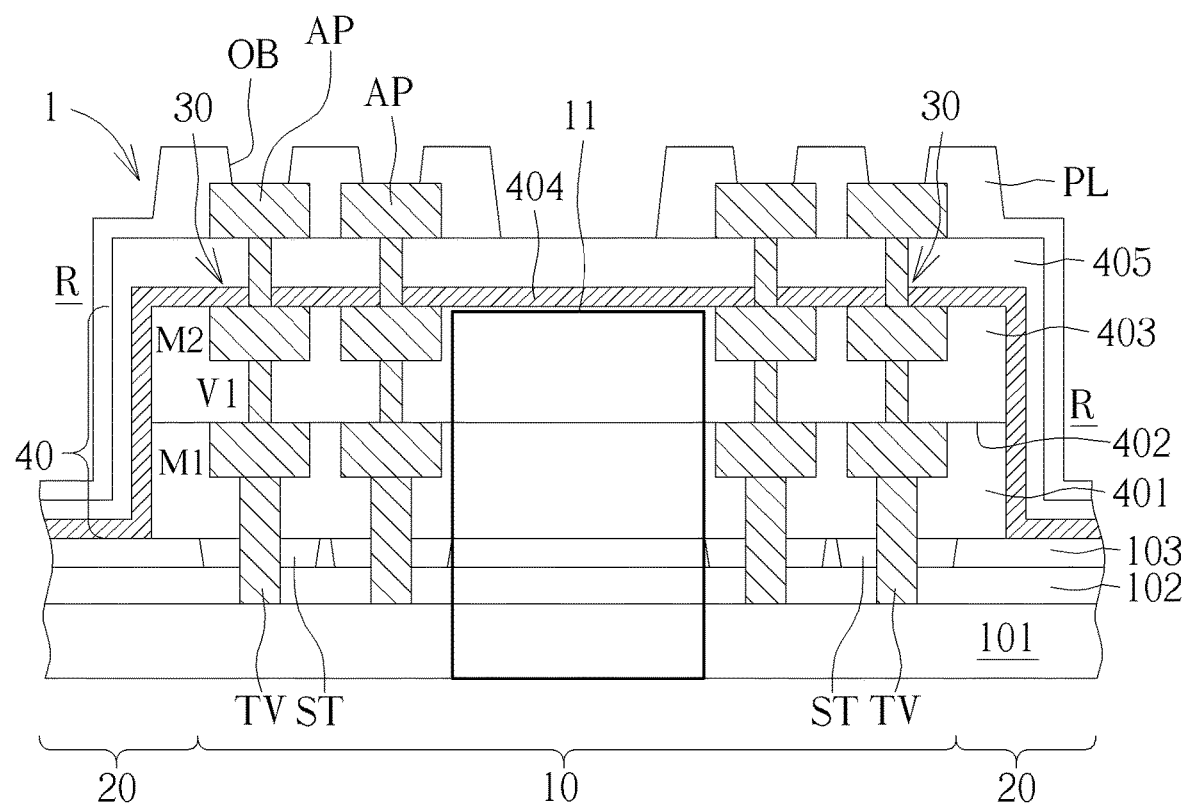

As shown in FIG. 5, next, an uppermost dielectric film 405 is formed to cover the moisture blocking layer 404 and the dielectric stack 40. According to an embodiment of the invention, the uppermost dielectric film 405 includes silicon oxide. Next, an uppermost via Vn is formed in the uppermost dielectric film 405, penetrating the uppermost dielectric film 405 and the moisture blocking layer 404 to electrically connect with the second metal wiring layer M2. Next, an aluminum pad AP is formed on the uppermost dielectric film 405, which is disposed on the uppermost via Vn, and is electrically connected to the uppermost via Vn. Next, a passivation layer PL is deposited to conformally cover the uppermost dielectric film 405. According to an embodiment of the present invention, the passivation layer PL may include polyimide, silicon nitride, or silicon oxide.

According to an embodiment of the present invention, the passivation layer PL covers the periphery of the aluminum pad AP and the top surface of the uppermost dielectric film 405. According to an embodiment of the present invention, a photolithography process and an etching process can be used to form an opening OB in the passivation layer PL, exposing a portion of the upper surface of the aluminum pad AP for subsequent connection with an external circuit.

Structurally, as shown in FIG. 5, the integrated circuit device 1 of the present invention includes: a substrate 100; an integrated circuit region 10 located on the substrate 100, wherein the integrated circuit region 10 includes a dielectric stack 40; a seal ring 30 provided in the dielectric stack 40 and surrounding the integrated circuit region 10; a trench R, surrounding the seal ring 30 and revealing a sidewall 40a of the dielectric stack 40; a moisture blocking layer 404 continuously covering the integrated circuit region 10 and extending to the sidewall 40a of the dielectric stack 40, thereby sealing a boundary 402 between two adjacent dielectric films 401 and 403 of the dielectric stack 40; and a passivation layer PL located on the moisture blocking layer 404.

According to an embodiment of the invention, the integrated circuit region 10 includes a radio frequency circuit 11. According to an embodiment of the present invention, the substrate 100 is a silicon-on-insulating substrate, which includes a lower substrate 101, a buried oxide layer 102, and a device layer 103 on the buried oxide layer 102. According to an embodiment of the invention, the device layer 103 includes a silicon layer.

According to an embodiment of the present invention, the seal ring 30 is a discontinuous seal ring. According to an embodiment of the present invention, the seal ring 30 is composed of interconnected metal wires M and vias V. According to an embodiment of the present invention, the metal wires M include an uppermost copper metal wire M2, and the moisture blocking layer 404 directly contacts the uppermost copper metal wire M2. According to an embodiment of the present invention, the uppermost copper metal wire M2 is an uppermost damascene copper wire, and the moisture blocking layer 404 also serves as a capping layer for capping the top surface of the uppermost damascene copper wire. According to an embodiment of the present invention, the seal ring 30 is electrically coupled to the lower substrate 101 via a through contact TV penetrating through the device layer 103 and the buried oxide layer 102.

According to an embodiment of the present invention, the two adjacent dielectric films 401 and 403 are two adjacent low dielectric constant dielectric films. According to an embodiment of the present invention, the integrated circuit device 1 further includes: an uppermost dielectric film 405 covering the dielectric stack 40; and an uppermost via Vn penetrating the uppermost dielectric 405 and the moisture blocking layer 404 to electrically connect to the uppermost copper metal wire M2; and an aluminum pad AP provided on the uppermost via Vn and electrically connected to the uppermost via Vn.

According to an embodiment of the present invention, the passivation layer PL covers the periphery of the aluminum pad AP and the top surface of the uppermost dielectric film 405. According to an embodiment of the invention, the uppermost dielectric film 405 includes silicon oxide. According to an embodiment of the present invention, the passivation layer PL includes polyimide, silicon nitride, or silicon oxide. According to an embodiment of the invention, the moisture blocking layer 404 includes silicon nitride, silicon oxynitride, or silicon carbonitride.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit device, comprising:
a substrate;
an integrated circuit region on the substrate, said integrated circuit region comprising a dielectric stack;
a seal ring disposed in said dielectric stack and around a periphery of said integrated circuit region;
a trench around the seal ring and exposing a sidewall of said dielectric stack;
a moisture blocking layer continuously covering said integrated circuit region and extending to said sidewall of said dielectric stack, thereby sealing a boundary between two adjacent dielectric films in said dielectric stack; and
a passivation layer over said moisture blocking layer.

2. The integrated circuit device according to claim 1, wherein said integrated circuit region comprises a radio-frequency (RF) circuit.

3. The integrated circuit device according to claim 1, wherein said substrate is a silicon-on-insulator (SOI) substrate comprising a lower substrate, a buried oxide layer on the lower substrate, and a device layer on the buried oxide layer.

4. The integrated circuit device according to claim 3, wherein said device layer comprises a silicon layer.

5. The integrated circuit device according to claim 3, wherein said seal ring is electrically coupled to said lower substrate with a through contact that penetrates through said device layer and said buried oxide layer.

6. The integrated circuit device according to claim 1, wherein said two adjacent dielectric films are two adjacent low-dielectric constant (low-k) dielectric films.

7. The integrated circuit device according to claim 1, wherein said seal ring is a discontinuous seal ring.

8. The integrated circuit device according to claim 7, wherein said seal ring is composed of interconnected metal wires and vias.

9. The integrated circuit device according to claim 8, wherein said metal wires comprise an uppermost copper metal wire and said moisture blocking layer is in direct contact with said uppermost copper metal wire.

10. The integrated circuit device according to claim 9, wherein said uppermost copper metal wire is an uppermost damascene copper wire and said moisture blocking layer also acts as a capping layer covering a top surface of said uppermost damascene copper wire.

11. The integrated circuit device according to claim 10 further comprising:

an uppermost dielectric film covering said moisture blocking layer;

an uppermost via penetrating through said uppermost dielectric film and said moisture blocking layer to electrically connect with said uppermost copper metal wire; and an aluminum pad disposed on and electrically connected to said uppermost via.

12. The integrated circuit device according to claim 11, wherein said passivation layer covers a periphery of said aluminum pad and a top surface of said uppermost dielectric film.

13. The integrated circuit device according to claim 12, wherein said uppermost dielectric film comprises silicon oxide.

14. The integrated circuit device according to claim 12, wherein said passivation layer comprises polyimide, silicon nitride, or silicon oxide.

15. The integrated circuit device according to claim 1, wherein said moisture blocking layer comprises silicon nitride, silicon oxynitride, or silicon carbonitride.

* * * * *